United States Patent
Juloski et al.

(10) Patent No.: US 10,261,484 B2
(45) Date of Patent: Apr. 16, 2019

(54) MAGNETIC RESONANCE APPARATUS AND METHOD FOR THE OPERATION THEREOF

(71) Applicant: Siemens Aktiengesellschaft, Munich (DE)

(72) Inventors: Aleksandar Juloski, Nuremberg (DE); Ludwig Kreischer, Dormitz (DE); Stefan Nowak, Hessdorf (DE)

(73) Assignee: Siemens Aktiengesellschaft, Munich (DE)

( * ) Notice: Subject to any disclaimer, the term of this patent is extended or adjusted under 35 U.S.C. 154(b) by 651 days.

(21) Appl. No.: 14/851,317

(22) Filed: Sep. 11, 2015

(65) Prior Publication Data

US 2016/0077173 A1  Mar. 17, 2016

(30) Foreign Application Priority Data

Sep. 11, 2014  (DE) .................. 10 2014 218 183
Aug. 5, 2015  (DE) .................. 10 2015 214 925

(51) Int. Cl.
| | |
|---|---|
| *G01R 33/36* | (2006.01) |
| *G01R 33/34* | (2006.01) |
| *G05B 17/02* | (2006.01) |
| *G01R 33/385* | (2006.01) |
| *G01R 33/54* | (2006.01) |

(52) U.S. Cl.
CPC ......... *G05B 17/02* (2013.01); *G01R 33/3852* (2013.01); *G01R 33/543* (2013.01)

(58) Field of Classification Search
None
See application file for complete search history.

(56) References Cited

U.S. PATENT DOCUMENTS

| | | | | |
|---|---|---|---|---|
| 6,211,675 B1* | 4/2001 | Ganin | ............. | G01R 33/56518 |
| | | | | 324/309 |
| 6,448,773 B1* | 9/2002 | Zhang | ............. | G01R 33/56518 |
| | | | | 324/307 |
| 8,781,197 B2* | 7/2014 | Wang | ............. | G01R 33/54 |
| | | | | 382/131 |
| 9,194,926 B2* | 11/2015 | Dietz | ............. | G01R 33/54 |
| 2005/0275404 A1* | 12/2005 | Sabate | ............. | G01R 33/3852 |
| | | | | 324/322 |

(Continued)

FOREIGN PATENT DOCUMENTS

| | | | |
|---|---|---|---|
| DE | 102012202416 B3 * | 6/2013 | ......... G01R 33/3854 |
| JP | 2013000173 A * | 1/2013 | |

*Primary Examiner* — Jermele M Hollington
(74) *Attorney, Agent, or Firm* — Schiff Hardin LLP

(57) ABSTRACT

In method for operating a magnetic resonance apparatus that has a gradient power amplifier that supplies a voltage to a gradient coil, and a gradient power amplifier control processor that provides control a control signal thereto that predetermines the aforementioned voltage, and a simulation computer that models an operational characteristic of each of the gradient coil the gradient power amplifier, an actual current value of a current fed into the gradient coil by the gradient power amplifier is measured and a target current value of the current fed into the gradient coil by the gradient power amplifier is determined by the simulation computer, using the control signal as an input variable. A fault signal is generated as a function of a determined deviation in the actual current value from the target current value.

11 Claims, 1 Drawing Sheet

(56) References Cited

U.S. PATENT DOCUMENTS

| | | | |
|---|---|---|---|
| 2011/0044524 A1* | 2/2011 | Wang | G01R 33/54 |
| | | | 382/131 |
| 2011/0133832 A1* | 6/2011 | Hollander | G01R 33/022 |
| | | | 330/75 |
| 2013/0214784 A1 | 8/2013 | Dietz et al. | |
| 2013/0238286 A1* | 9/2013 | Van Liere | A61B 5/055 |
| | | | 702/188 |
| 2014/0139218 A1* | 5/2014 | Findeklee | G01R 33/3628 |
| | | | 324/318 |
| 2014/0232396 A1* | 8/2014 | Grodzki | G01R 33/543 |
| | | | 324/309 |
| 2015/0137813 A1* | 5/2015 | Chenevert | G01R 33/56341 |
| | | | 324/322 |
| 2015/0177345 A1* | 6/2015 | Ham | G01R 33/3852 |
| | | | 324/309 |
| 2016/0282431 A1* | 9/2016 | Dewdney | G01R 33/389 |
| 2016/0299208 A1* | 10/2016 | Shigeta | G01R 33/56554 |
| 2017/0315197 A1* | 11/2017 | Schneider | G01R 33/32 |
| 2017/0343636 A1* | 11/2017 | Kroell | G01R 33/567 |

\* cited by examiner

Gradient Power Amplifier

Gradient Power Amp. Control Processor

Simulation Computer

Comparator

Gradient Power Amplifier

MAGNETIC RESONANCE APPARATUS AND METHOD FOR THE OPERATION THEREOF

BACKGROUND OF THE INVENTION

Field of the Invention

The invention concerns a method for operating a magnetic resonance apparatus, as well as a magnetic resonance apparatus.

Description of the Prior Art

In order to generate the magnetic field gradients required for magnetic resonance imaging, currents on the order of magnitude of up to 1200 A must be generated by a gradient power amplifier and then flow through a gradient coil. The gradient power amplifier for this purpose provides a controlled output voltage. In order to ensure a correct and above all reliable operation of the magnetic resonance scanner, aside from temperature sensors, overcurrent protection and oscillation detections, typically a current measuring means is also provided that acquires the current generated by the gradient power amplifier. This is because the currents required for the imaging that flow through the gradient coil have to be controlled and adjusted with extreme precision. Moreover, the current measuring means must itself be monitored, because it might return faulty current values.

The current measuring means is generally monitored by a current sensor provided in addition to the current measuring means, which in most instances measures less precisely and is connected in a return current path from the gradient coil to the gradient power amplifier. If the current values measured by the current measuring facility and the current sensor deviate significantly from one another, a malfunction of the current measuring means is assumed and a fault signal is emitted. Consequently, the measurement result of the significantly more precise current measuring means, which is included in the control of the output voltage of the gradient power amplifier, is verified by the measurement result of the current sensor.

This is disadvantageous because the provision of a current sensor for monitoring the current measuring means involves additional switching and material outlay. Moreover, certain faults in the current path, for instance a short-circuit between the windings of the gradient coil or a rupture with an arcing within the conductor of a gradient coil, have no influence on the currents flowing in the forward and return current paths, so they cannot be detected in this way.

DE 10 2012 202 416 B3 discloses a method for operating a coil, through which an alternating current flows, wherein a mechanical resonance behavior of the coil is identified and reproduced by an electrical oscillating circuit model. A check is made to determine whether an alternating current to be sent through the coil produces a resonance behavior in the electrical oscillating circuit model, whereupon current flow through the coil is blocked if the resonance behavior exceeds a predetermined limit value.

Furthermore, U.S. 2011/0133832 A1 discloses a digital amplifier for supplying a load with a controlled output signal, including a power source and a reference power generator for generating an analog reference power from a digital input signal. A coupling control device is provided for the digital control of the reference power generator, which emulates the output power properties of the power source.

SUMMARY OF THE INVENTION

An object of the invention is to provide a method of the type described above, which enables an improved detection of fault states of the gradient power amplifier and/or the gradient coil.

This object is achieved according to the invention by a method for operating a magnetic resonance apparatus, that includes a gradient power amplifier for generating an electrical voltage supplied to a gradient coil downstream of the gradient power amplifier, and a gradient power amplifier control processor that controls the gradient power amplifier by producing and emitting a control signal that predetermines the voltage to be generated, and wherein the magnetic resonance apparatus has a simulation computer that models at least one operational characteristic of the gradient coil and at least one operational characteristic of the gradient power amplifier. The method includes the steps of acquiring an actual current value of a current, that is fed into the gradient coil by the gradient power amplifier, with a current measuring circuit, determining a target current value of the current fed into the gradient coil by the gradient power amplifier by operation of the simulation computer, using the control signal as an input variable, and generating a fault signal as a function of a determined deviation of the actual current value from the target current value.

The basis of the invention is to determine the target current value by a simulation, with the control signal used as an input variable, and comparing the target current value with the measured actual current value by taking at least one known operational characteristic of the gradient power amplifier, and at least one operational characteristic of the gradient coil, into account. The analog or digital control signal is for this purpose provided to the gradient power amplifier by the gradient power amplifier control processor, this control signal predetermining the voltage to be emitted as an output to the gradient coil. This voltage applied to the gradient coil generates a current flowing through the gradient coil, which can be determined by the current measuring circuit in order to evaluate that current to control the voltage by operation of the gradient power amplifier control processor.

As noted above, in accordance with the invention the current generated by the gradient power amplifier is first measured. The measurement result in this case represents the actual current value. In order to ensure a correct function of the gradient power amplifier and/or the gradient coil, this measured value must be as accurate as possible, as a result of which it is to be constantly monitored during operation of the magnetic resonance apparatus.

In a further step, the target current value is determined in accordance with the invention by the simulation computer. To this end, at least one operational characteristic of the gradient power amplifier and the gradient coil are modeled in each case within the simulation computer. The at least one operational characteristic of the gradient power amplifier describes the output voltage as a function of the incoming control signal, so it is basically known and constant with a correct function. This allows the at least one operational characteristic of the gradient power amplifier to be stored in the simulation computer in static form. The operational characteristics of the gradient coils are also constant over certain areas after their manufacture, provided there are no defects. The at least one operational characteristic of the gradient coil is preferably modeled here as a network of resistances and/or inductances and/or capacitances. The current produced upon application of a voltage resulting from the control signal to the gradient coil thus can be simulated or calculated by resolving differential equations describing this network.

The acquired actual current value is then compared in accordance with the invention with the determined target current value, and a deviation is determined. A fault signal is then generated as a function of this deviation, since it is possible to conclude that a faulty detection of the actual current value by the current measuring circuit has occurred or a defect of the gradient power amplifier or the gradient coil exists. The fault signal can be generated if and when the deviation reaches a predetermined threshold value.

In accordance with the inventive method, not only is the need for the current sensor to verify the actual current value determined with the current measuring facility that is advantageously omitted, but also the presence of faults in the current path, like for instance a short-circuit within the windings of a gradient coil, can be identified, in which the current in the forward and return path is not different. In particular, faults can be detected that are caused by a change in the at least one operational characteristic of the gradient coil. Moreover, the presence of faulty operating states of the gradient power amplifier can be identified especially advantageously, which result for instance from a failure of individual amplifier stages, since in this case the actual output voltage deviates from the voltage predetermined by the control signal and thus also results in a deviation between the target current value and the actual current value.

Malfunctions that can be identified are, for instance:
a malfunction of the current measuring facility;
a short circuit between the gradient coil and further gradient coils;
a short circuit within coil windings of the gradient coil;
damage to terminals or supply lines to the gradient coil; and
a rupture in a gradient coil or a supply line to the gradient coil with arcing.

It should be noted that only the first two cited malfunctions can be identified by a conventional method of the type described at the outset, since a deviation between a first measured value acquired with a current measuring facility and a second measured value acquired with a current sensor is produced herewith. The detection of all these interferences, which the inventive solution allows, provides for increased system stability.

The inventive method can make use of a network describing the operational characteristic of the gradient coil, including a series circuit of a resistance and an inductance, to be used to represent the operational characteristic of the gradient coil in the simulation. Such a modeling of the gradient coil can be implemented particularly easily and calculated with little outlay by the simulation computer. In such cases, a series circuit of a resistance and an inductance represents an approach to the real operational characteristics of the gradient coil that is sufficient in many practical applications.

For higher precision of the modeling, the network can also include at least one parasitic capacitance and/or at least one parasitic inductance of the gradient coil and/or their connecting lines to the gradient power amplifier. Parasitic influences of this type are produced by the spatial proximity of the windings of the gradient coils to other electrical conductors. Taking the influences produced therefrom by the modeled network into account consequently enables the determination of a more precise target current value.

With the inventive method, it is further particularly expedient for its output voltage characteristic curve to be used as an operational characteristic of the gradient power amplifier, while controlling the amplifier using a digital or analog control signal. Such an output voltage curve consequently models the reaction of the gradient power amplifier to the obtained control signal. With a digital control signal, binarily predetermined voltage value can be evaluated from the control signal for instance or determined by means of a look-up table for instance. With an analog control signal, an in particular non-linear transmission curve can be stored in the simulation facility as an output voltage curve.

With the inventive method, it is preferable for at least one of the at least one operational characteristic of the gradient coil was determined prior to commissioning of the gradient coil and/or the gradient power amplifier. Since the manufacture of gradient coils and/or gradient power amplifiers typically takes place under specific, consequently well-defined conditions, the operational characteristics can be determined individually or for all models of a manufacturing batch in particular immediately after manufacture.

Moreover, in the inventive method the at least one operational characteristic of the gradient coil can be determined during its operation by a network analysis of the gradient coil. The magnetic resonance apparatus to this end has a suitable network analyzer for the gradient coil, so that the operational characteristics can be determined even during operation, in other words after commissioning, but not necessarily during an imaging process. A series of steep current and/or voltage pulses can be applied to the gradient coil for instance, in order to experimentally determine its dynamic behavior. It is naturally also conceivable only to check and/or optimize the modeled operating parameters of the gradient coil stored in the simulation facility by means of such a process.

With the inventive method it is preferred for the gradient power amplifier to be transferred into a safe state, in particular deactivated, in the presence of the fault signal. If the presence of a deviation is consequently identified, it is no longer possible to assume a correct operation of the overall magnetic resonance apparatus. Corrective maintenance is then generally required. It is also possible for a corresponding warning message to be emitted in the presence of the fault signal.

The invention also encompasses a magnetic resonance apparatus, that includes a gradient power amplifier for generating an electric voltage supplied to a gradient coil downstream of the gradient power amplifier, and a gradient power amplifier control processor that controls the gradient power amplifier by emitting a control signal that predetermines the voltage to be generated, and a simulation computer that models at least one operational characteristic of the gradient coil and at least one operational characteristic of the gradient power amplifier, and a current measuring circuit. The inventive magnetic resonance apparatus has control computer that includes the gradient power amplifier control processor and the simulation computer, which is configured to implement the inventive method.

In the inventive magnetic resonance apparatus, the control computer preferably is realized as a single control entity, in particular as an FPGA or a microcontroller. A particularly flexible implementation, particularly with respect to changes in the operational characteristics of the gradient coil and/or the operational characteristics of the gradient power amplifier, is thereby achieved. It is alternatively possible to implement the simulation computer as an analog circuit.

The invention further encompasses a non-transitory, computer readable data storage medium, which can be loaded directly into a memory of a programmable control computer of a magnetic resonance apparatus. The storage medium is encoded with a program code in order to execute all the steps of the inventive method, when the program code is executed in the control computer of the magnetic resonance apparatus. All or various afore-described embodiments of the inventive method can be executed with this program code. The program code may require program means, e.g. libraries and auxiliary functions, in order to realize the corresponding embodiments of the method. The program code may be a source code that must still be compiled and linked or which only has to be interpreted, or an executable software code, which for execution purposes only has to be loaded into the corresponding computing unit.

The computer-readable storage medium with electronically readable control information stored thereon can be e.g. a DVD, a magnetic tape or a USB stick.

The advantages of the inventive magnetic resonance apparatus and the inventive electronically readable storage medium essentially correspond to the advantages of the inventive method, as explained above in detail. Features, advantages or alternative embodiments mentioned herein are applicable to all of the different aspects of the invention.

DESCRIPTION OF THE PREFERRED EMBODIMENTS

Figure 1:
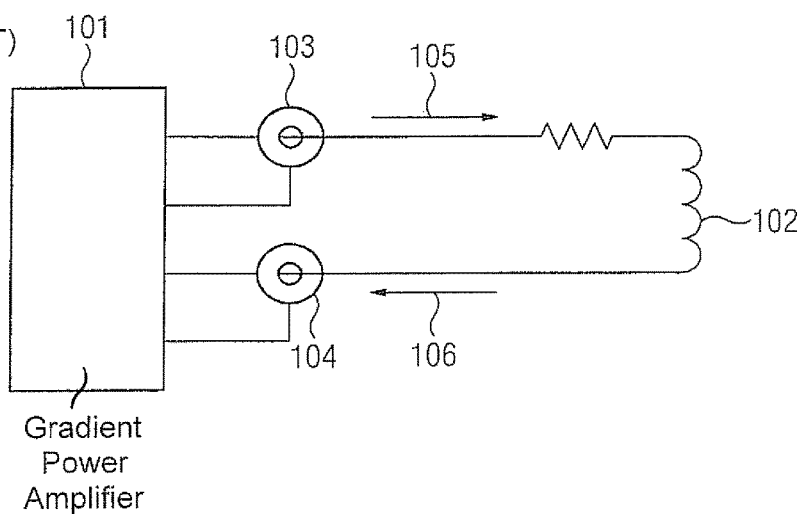
FIG. 1 illustrates monitoring of a gradient power amplifier and a gradient coil according to the prior art.

FIG. 1 shows monitoring of a gradient power amplifier 101 and a gradient coil 102 according to the prior art.

For the actual imaging, the currents which flow through the gradient coil 102 must be controlled and adjusted with extreme precision. To this end, an integrated current measuring facility 103 must be monitored since this could return faulty current values.

The monitoring of this current measuring facility 103 generally takes place by means of a current sensor 104, which in most cases measures in a less precise manner and is connected in a feedback path 106. If the two current values measured by the two sensors deviate significantly from one another, a fault signal can be output.

Faults in the current path, like for instance a short-circuit within the windings of the gradient coil 102, which do not generate a deviation between the currents in the forward current path 105 and in the return current path 106, can however not be detected in this way.

Figure 2:
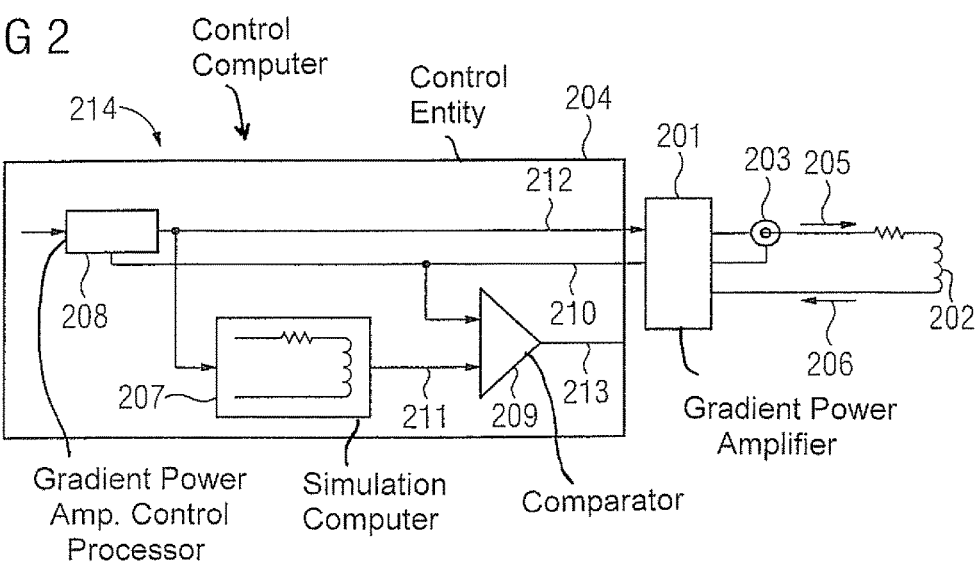
FIG. 2 is a block diagram of inventive magnetic resonance apparatus.

FIG. 2 shows an inventive magnetic resonance apparatus that has a gradient power amplifier 201, a gradient coil 202, a current measuring circuit 203 and a control computer 214.

Instead of the conventional current sensor 104, in addition to the current measuring circuit 203, a simulation computer 207 associated with the control computer 214 is used in the invention. The control computer 214 furthermore has a gradient power amplifier control processor 208, which controls the gradient power amplifier 201, and a comparator 209. A feedback branch is provided between the gradient power amplifier control computer 208 and the current measuring circuit 203 in order to control the gradient power amplifier 201. The control computer 214 is embodied as a single control entity 204, such as a field programmable gate array (FPGA). Alternatively, a realization of the control entity 204 as a programmable microcontroller is possible.

The gradient power amplifier 201 provides the gradient coil 202 with electrical voltage, which produces a current flowing in a forward current path 205 into the gradient coil 202, wherein the current circuit between the gradient power amplifier 201 and the gradient coil 202 is closed via a return path 206. The voltage provided by the gradient power amplifier 201 is predetermined by the gradient power amplifier control processor 208 by means of a digital control signal 212.

This control signal 212 is at the same time an input variable of the simulation computer 207, which models an operational characteristic of the gradient coil 202 through a network that includes a series circuit of a resistance and an inductance. Moreover, as an operational characteristic of the gradient power amplifier 201, the output voltage curve thereof is modeled as a look-up table when controlling takes place with the control signal 212, and is stored in the simulation computer 207. Furthermore, the simulation computer 207 can also model a substantially more complex network including resistances, inductances and capacitances, which as a result also map parasitic components of the gradient coil 201.

The modeled operational characteristic of the gradient power amplifier 201 and the modeled operational characteristic of the gradient coil 202 were in such cases determined prior to commissioning of the magnetic resonance facility after completion of manufacture. Since the manufacture takes place in a well-defined environment, the operational characteristics over the service life of the gradient power amplifier 201 and the gradient coil 202 are sufficiently stable, so that they are stored statically in the simulation computer 207.

The control computer 214 is configured to implement the inventive method. In such cases the current flowing through the voltage provided by means of the gradient power amplifier 201 in the forward current path 205 is measured by the current measuring circuit 203 and detected as an actual current value 210.

In a further step, the simulation computer 207 determines a target current value 211. To this end, it obtains the control signal 212 and calculates therefrom the voltage to be provided by the gradient power amplifier on the basis of its output voltage curve of the gradient coil 202. Finally, it simulates the current flowing through the gradient coil 202 upon excitation with the afore-determined voltage on the basis of the modeling of the operational characteristic of the gradient coil 202. To this end, it solves differential equations describing the modeled network comprising a series circuit of a resistance and an inductance and outputs the target current value 211.

Both the target current value 211 and the actual current value 210 are then supplied to the comparator 209. This compares the target current value 211 with the actual current value 210 and determines a deviation in the form of a sum of the difference between the actual current value 210 and the target current value 211. If this deviation reaches a predetermined threshold value, the comparator 209 emits a fault signal 213 as an output.

As soon as the fault signal 213 is within the magnetic resonance apparatus, this is interpreted as a malfunction and the gradient power amplifier 201 is deactivated, as a result of which the amplifier 201 and the gradient coil 202 are transformed into a more reliable state.

Possible malfunctions, the presence of which can be identified, are:

a malfunction of the current measuring computer 203, as a result of which this emits a faulty actual current value 210 deviating from the target current value 211;

a short circuit between the gradient coil 202 and further non-imaged gradient coils, as a result of which a change in the actual current value 210 occurs due to currents not discharging across the return current path 206;

a short circuit within coil windings of the gradient coil 202, as a result of which their resistance and/or inductance changes;

damage to terminals or supply lines to the gradient coils 202, as a result which the resistance increases;

malfunctions in the gradient power amplifier 201, in particular a failure of amplifier stages, as a result of which the provided voltage changes and a rupture in a gradient coil 202 or a supply line to the gradient coil 202 with an arcing, as a result of which its resistance increases for instance by 100 milliohms to 300 milliohms.

Furthermore, the modeled operational characteristics of the gradient coil 202 can also be changed following commissioning of the magnetic resonance apparatus. To this end, the gradient power amplifier control processor 208 controls the gradient power amplifier 201 in order to generate a series of steep current and/or voltage pulses. The current measuring circuit 203 acquires the actual current 210 flowing there through, which is not subjected to a network analysis in order to determine the operational characteristics of the gradient coil 202 by the means (not shown). The operational characteristics of the gradient coil 202 determined in the process can then replace or optimize the operational characteristics stored in the simulation computer 207.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus, said magnetic resonance apparatus comprising a gradient power amplifier that generates an electrical voltage supplied to a gradient coil connected downstream of the gradient power amplifier, and a gradient power amplifier control processor that generates a control signal that predetermines the voltage supplied by the gradient power amplifier to the gradient coil, said method comprising:

in a simulation computer of the magnetic resonance apparatus, modeling at least one operational characteristic of the gradient coil and at least one operational characteristic of the gradient power amplifier, by representing said operational characteristic of gradient coil in said simulation computer as a network that describes the gradient coil, said network comprising a series circuit of resistance and inductance;

detecting an actual current value of current fed to the gradient coil by the gradient power amplifier;

in said simulation computer, determining a target value of the current fed to the gradient coil by the gradient power amplifier using the control signal as an input variable;

in said simulation computer, generating a fault signal when said actual current value deviates from said target current value by a predetermined deviation; and emitting an electrical signal as an output from said simulation computer, said electrical signal representing said fault signal.

2. A method as claimed in claim 1 comprising including in said network at least one of said parasitic capacitance of said gradient coil, a parasitic inductance of said gradient coil, a parasitic capacitance of connecting lines between said gradient power amplifier and said gradient coil, and a parasitic inductance of connecting lines between said gradient power amplifier and said gradient coil.

3. A method as claimed in claim 1 comprising using an output voltage curve of said gradient power amplifier that occurs during control of said gradient power amplifier with said control signal, as said operational characteristic of said gradient power amplifier.

4. A method as claimed in claim 1 comprising determining said at least one operational characteristic of said gradient coil prior to commissioning said gradient coil.

5. A method as claimed in claim 1 comprising determining said at least operational characteristic of said gradient coil prior to commissioning said gradient power amplifier.

6. A method as claimed in claim 1 comprising determining said at least one operational characteristic of said gradient coil during operation of said gradient coil by a network analysis of said gradient coil.

7. A method as claimed in claim 1 comprising, upon an occurrence of said fault signal, automatically, from said gradient power amplifier control processor, transforming said gradient power amplifier into a state that presents no risk of harm to said magnetic resonance apparatus or to a patient in the magnetic resonance apparatus.

8. A method as claimed in claim 1 comprising, from said gradient power amplifier control processor, automatically deactivating said gradient power amplifier upon occurrence of said fault signal.

9. A magnetic resonance apparatus comprising:

a gradient amplifier that generates an electrical voltage supplied to a gradient coil connected downstream of the gradient power amplifier;

a gradient power amplifier control processor that generates a control signal that predetermines the voltage supplied by the gradient power amplifier to the gradient coil;

a simulation computer that models at least one operational characteristic of the gradient coil and at least one operational characteristic of the gradient power amplifier, by representing said operational characteristic of gradient coil in said simulation computer as a network that describes the gradient coil, said network comprising a series circuit of resistance and inductance;

a detector that detects an actual current value of current fed to the gradient coil by the gradient power amplifier;

said simulation computer determining a target value of the current fed to the gradient coil by the gradient power amplifier using the control signal as an input variable;

said simulation computer generating a fault signal when said actual current value deviates from said target current value by a predetermined deviation; and said simulation emitting an electrical signal as an output from said simulation computer, said electrical signal representing said fault signal.

10. A magnetic resonance apparatus as claimed in claim 9 wherein said gradient power amplifier processor and said simulation computer form a unitary control computer of the magnetic resonance apparatus, said control computer being formed as a freely programmable gate array (FPGA).

11. A non-transitory, computer-readable data storage medium encoded with programming instructions, said storage medium being distributively loaded into a gradient power amplifier control processor and a simulation computer of a magnetic resonance apparatus, said magnetic resonance apparatus comprising a gradient amplifier that generates an electrical voltage supplied to a gradient coil connected downstream of the gradient power amplifier, and said programming instructions causing said gradient power amplifier control processor to generate a control signal that predetermines the voltage supplied by the gradient power amplifier to the gradient coil, said programming instructions causing said simulation computer to:
- model at least one operational characteristic of the gradient coil and at least one operational characteristic of the gradient power amplifier, by representing said operational characteristic of gradient coil in said simulation computer as a network that describes the gradient coil, said network comprising a series circuit of resistance and inductance;
- receive a detected actual current value of current fed to the gradient coil by the gradient power amplifier;
- determine a target value of the current fed to the gradient coil by the gradient power amplifier using the control signal as an input variable;
- generate a fault signal when said actual current value deviates from said target current value by a predetermined deviation; and
- emit an electrical signal as an output from said simulation computer, said electrical signal representing said fault signal.

* * * * *